United States Patent
Kumar et al.

(10) Patent No.: US 11,082,267 B1
(45) Date of Patent: Aug. 3, 2021

(54) MULTI-TAP HYBRID EQUALIZATION SCHEME FOR 24GBPS GDDR6 MEMORY INTERFACE TRANSMITTER

(71) Applicant: CADENCE DESIGN SYSTEMS, INC., San Jose, CA (US)

(72) Inventors: Vinod Kumar, Pratapgarh (IN); Harsh Anil Shakrani, Thane (IN); Balbeer Rathor, Morena (IN)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days.

(21) Appl. No.: 16/904,019

(22) Filed: Jun. 17, 2020

(51) Int. Cl.
*H04L 25/03* (2006.01)
*G11C 7/10* (2006.01)

(52) U.S. Cl.
CPC ...... *H04L 25/03885* (2013.01); *G11C 7/1048* (2013.01); *H04L 25/03025* (2013.01); *H04L 25/03159* (2013.01)

(58) Field of Classification Search
CPC ......... H04L 25/03885; H04L 25/03025; H04L 25/03159; H04L 2025/03471; G11C 7/1048
See application file for complete search history.

(56) References Cited

U.S. PATENT DOCUMENTS

| | | | |
|---|---|---|---|
| 10,284,395 B2 * | 5/2019 | Chiu | H04L 7/0037 |
| 10,848,352 B1 * | 11/2020 | Rathor | G11C 7/222 |
| 2018/0351770 A1 * | 12/2018 | Chiu | H04L 25/03057 |
| 2019/0173697 A1 * | 6/2019 | Zerbe | H01L 21/31116 |

* cited by examiner

*Primary Examiner* — Freshteh N Aghdam
(74) *Attorney, Agent, or Firm* — Foley & Lardner LLP

(57) ABSTRACT

The embodiments described herein provide for a method and system for implementing a multi-tap hybrid-equalization technique devoid of ISI jitter and PSI jitter in the high-speed data path to achieve 24 Gbps operating speed in systems utilizing GDDR6 DRAM. The method includes receiving an original data signal at a first TFFE circuit and receiving an altered data signal at a second TFFE circuit. The method further comprises generating a time-domain-equalized original data signal using a set of TFFE coefficients from the original data signal. The method further comprises generating a time-domain-equalized altered data signal using the set of TFFE coefficients from the altered data signal. The method further comprises generating, a time-and-voltage-domain-equalized data signal from the time-domain-equalized original data signal and the time-domain-equalized altered data signal at a voltage-feed forward equalization (VFFE) circuit using a set of VFFE coefficients.

20 Claims, 7 Drawing Sheets

MULTI-TAP HYBRID EQUALIZATION SCHEME FOR 24GBPS GDDR6 MEMORY INTERFACE TRANSMITTER

TECHNICAL FIELD

The present invention relates generally to the field of high-speed memory interface transmitters. More specifically, the present invention relates generally to equalization of data signals in high-speed memory interface transmitters.

BACKGROUND

Emerging technologies like artificial intelligence, machine learning and high-speed graphics need a high speed memory interface to communicate with high bandwidth memory for use in graphics cards, game consoles, and high-performance computing, such as graphics double data rate type six synchronous dynamic random access memory (GDDR6 DRAM), in which the per pin speed can be up to 24 Gbps or higher. For use in a system with GDDR6, the input/output (I/O) interface at the system-on-a-chip (SOC) side must operate at 24 Gbps or higher. In such a transmitter, the signals may not have sufficient time to reach the proper logic level, as the bit duration is very small. As a result, the transmitted high-speed data signals experience high levels of Inter Symbol Interference (ISI) jitter, which reduces the timing margin for the system.

In some high-performance memory products, equalization of the data path in high-speed transmitters is necessary in systems utilizing GDDR6 to reduce the ISI jitter and gain a timing margin necessary for the data signals to reach the proper logic level. Several high-speed transmitting equalization techniques are utilized to reduce ISI jitter, such as pre-emphasis equalization, de-emphasis equalization, and time-based feed forward equalization (TFFE).

In pre-emphasis equalization, high frequency transitions can be made faster by using additional driver slices in parallel to the main driver. Pre-emphasis equalization effectively reduces ISI jitter introduced at the output driver stage, and does not consume DC power or affect the DC output voltage level. However, pre-emphasis also presents several disadvantages. For example, pre-emphasis can change the effective output driver impedance, thereby degrading the signal integrity. Pre-emphasis also increases switching current from supply during transition, resulting in more noise introduced on the Power Delivery Network (PDN) and degrading the Power Supply Induced (PSI) jitter. Pre-emphasis equalization also requires an additional driver in parallel to the main driver, thereby increasing the I/O area and the effective PAD capacitance. Pre-emphasis further is known to have limited coefficient settings.

In de-emphasis equalization, the direct current (DC) logic level of low frequency bits are reduced by turning on a fraction of driver slices that feed current in an opposite direction to the low frequency bits. De-emphasis reduces ISI jitter introduced at the output driver stage. The effective output driver impedance remains the same, unlike in pre-emphasis, thereby eliminating any degradation in signal integrity. The number of output driver slices in de-emphasis equalization remain consistent, resulting in no impact on the effective PAD capacitance. However, de-emphasis presents disadvantages in the following forms: increased DC power consumption at the driver and reduced DC logic levels of the output signals occur; additional circuit elements including a high-speed data level shifter and data path are required; and limited coefficient settings are available.

In TFFE, the high frequency bit duration of the data is dynamically modulated based on the status of previously transmitted bits. TFFE effectively reduces ISI jitter introduced at the output driver stage and the internal data path. The number of output driver slices and the effective output driver impedance remain the same when using TFFE, thereby preserving the signal integrity and the effective PAD capacitance, unlike pre-emphasis. TFFE further experiences no impact on the DC power consumption or the DC logic level of the output driver, unlike de-emphasis. However, several limitations of TFFE exist, namely, the unit interval (UI) of the bit becomes very small (~41 ps) with increased speed, resulting in a narrow time margin for TFFE logic across the process, voltage and temperature (PVT). The narrow time margin causes difficulty in wider equalization (e.g., higher frequency), which experiences a slow transition at the Phase Interpolation node, resulting in the high-speed data path having increased sensitivity to PSI Jitter.

As transmitter speed increases to 24 Gbps or more, the bit duration becomes increasingly smaller, and each stage in the data path of the transmitter can introduce ISI jitter. As both pre-emphasis and de-emphasis transmitter equalization techniques improve ISI jitter introduced only at the driver stage, with no improvement in the ISI jitter introduced at intermediate stages of the data path, neither equalization technique is suitable for high-speed transmitters. The TFFE transmitter equalization technique improves both the ISI jitter introduced at intermediate stages of the data path as well as the ISI jitter introduced at the driver stage. However, as transmitter speed increases toward the desired 24 Gbps in systems using GDDR6 DRAM, achieving enough TFFE range to equalize effectively both the internal data path ISI jitter and driver stage ISI Jitter becomes increasingly difficult. In addition, a wider TFFE range at higher speed increases the sensitivity of the high-speed data path to power supply noise, resulting in a PSI jitter increase with increasing TFFE range.

SUMMARY

Disclosed herein are systems and methods to address the above-noted shortcomings in known equalization techniques, and may provide additional or alternative benefits as well. As mentioned, there is a desire for new methods and/or hardware components that allow for high-speed transmitters to be capable of equalizing both driver stage ISI jitter and PVT-dependent intermediate data path ISI jitter without causing PSI jitter in the high-speed data path. The embodiments described herein provide for an equalization technique for addressing both driver stage ISI jitter and intermediate data path ISI jitter through a hybridization of equalization techniques to eliminate the shortcomings of such techniques used alone. The embodiments described herein further provide a hybrid-equalization technique devoid of PSI jitter in the high-speed data path to achieve the desired 24 Gbps operating speed in systems utilizing GDDR6 DRAM.

In an embodiment, a method for equalization of data signals, where the method comprises receiving, by a first time-feed forward equalization (TFFE) circuit, an original data signal comprising original data bits and an enable signal comprising enable data bits; receiving, by a second TFFE circuit, an altered data signal comprising altered data bits and an altered enable signal comprising altered enable bits; generating, by the first TFFE circuit, from the original data signal and the enable signal, a time-domain-equalized original data signal using a set of TFFE coefficients; generating, by the second TFFE circuit, from the altered data signal and the altered enable signal, a time-domain-equalized altered data signal using the set of TFFE coefficients; and generating, at a voltage-feed forward equalization (VFFE) circuit coupled to the first and second TFFE circuits, a time-and-voltage-domain-equalized data signal from the time-domain-equalized original data signal and the time-domain-equalized altered data signal using a set of VFFE coefficients.

In another embodiment, a programmable circuit for equalization of data signals comprises a first time feed forward equalization (TFFE) circuit and a second TFFE circuit configured to: receive, by the first TFFE circuit, an original data signal comprising original data bits, and an enable signal comprising enable bits; receive, by the second TFFE circuit, an altered data signal comprising altered data bits and an altered enable signal comprising altered enable bits; generate, by the first TFFE circuit, from the original data signal and the altered data signal according to a set of TFFE coefficients, a time-domain-equalized original data signal; and generate, by the second TFFE circuit, from the altered data signal and the altered enable signal according to the set of TFFE coefficients, a time-domain-equalized altered data signal; and a voltage feed forward equalization (VFFE) circuit coupled to each of the TFFE circuits, the VFFE circuit configured to: generate, from the time-domain-equalized original data signal and the time-domain-equalized altered data signal, a time-and-voltage-domain-equalized data signal according to a set of VFFE coefficients.

It is to be understood that both the foregoing general description and the following detailed description are exemplary and explanatory and are intended to provide further explanation of the invention as claimed.

BRIEF DESCRIPTION OF THE DRAWINGS

The present disclosure can be better understood by referring to the following figures. The components in the figures are not necessarily to scale, emphasis instead being placed upon illustrating the principles of the disclosure. In the figures, reference numerals designate corresponding parts throughout the different views.

DETAILED DESCRIPTION

Figure 1:
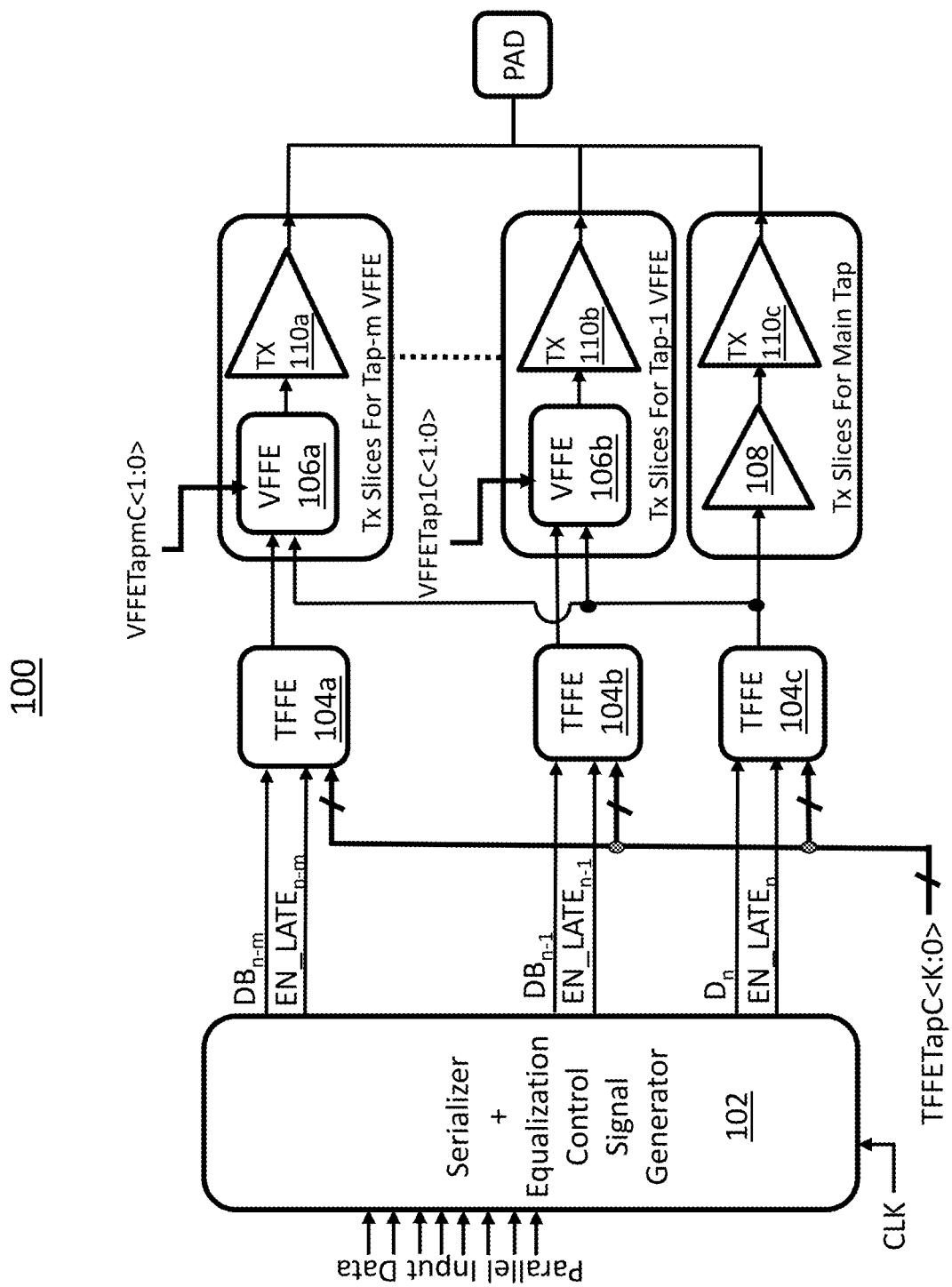
FIG. 1 is a block diagram illustrating a transmitter implementing a hybrid equalization technique, according to an embodiment.

Reference will now be made to the exemplary embodiments illustrated in the drawings, and specific language will be used here to describe the same. It will nevertheless be understood that no limitation of the scope of the invention is thereby intended. Alterations and further modifications of the inventive features illustrated here, and additional applications of the principles of the inventions as illustrated here, which would occur to a person skilled in the relevant art and having possession of this disclosure, are to be considered within the scope of the invention.

The embodiments herein provide an improved method and system for equalization of high-speed data signals by combining a Time-based Feed Forward Equalization (TFFE) scheme with a Voltage-based Feed Forward Equalization (VFFE) in a single transmitter, thereby creating a hybrid equalization scheme. The hybrid equalization scheme uses TFFE for internal data path ISI Jitter reduction, and uses VFFE for driver-stage ISI jitter reduction and channel equalization. The TFFE circuit performs time domain modulation of the input high-speed data signal input to the transmitter by a set of parallel TFFE circuits. Each TFFE circuit passes a time-domain modulated signal to a corresponding VFFE-controlled slice of a VFFE circuit. The VFFE circuit performs voltage-domain modulation of the bit slices at the transmitter output.

FIG. 1 illustrates a block diagram representation of a transmitter circuit 100 implementing a hybrid equalization technique, according to an embodiment. The transmitter circuit includes a serializer and equalization control signal generator block 102, a series of TFFE blocks 104a, 104b, and 104c, a series of VFFE blocks 106a and 106b, a signal buffer 108, and transmitter drivers 110a, 110b and 110c. Transmitter circuit 100 is implemented by using a plurality of transmitter slices connected in parallel, each parallel transmitter capable of handling one data slice at a time. Transmitter circuit 100 can process larger amounts of data in a same time frame. Transmitter circuit 100 can be connected to a processing circuit, such as a computer, microprocessor or other device capable of synchronous data transfer, and may be controlled by said device. Transmitter 100 may further connect to a memory such as Dynamic Random Access Memory (DRAM), in which data can be briefly stored and manipulated, and a long-term storage such as a database or other non-volatile memory for storing data and information for operation of the transmitter.

The serializer block 102 receives a set of parallel data inputs and a clock signal from a processing circuit. The parallel data inputs can be analog or digital signals composed of data bits received by serializer block 102, and can come from multiple sources. Serializer block 102 serializes the parallel inputs into a stream of bits; $D_n$ is the nth data bit being transmitted. The serializer 102 further generates one or more inverted and delayed data bits, $DB_{n-1}$ and $DB_{n-m}$, where $DB_{n-1}$ is the nth data bit inverted and delayed by one UI, and where $DB_{n-m}$ is the nth data bit inverted and delayed by a multiple (m) of the UI. The UI during operation is 1 divided by the data rate; for example, the UI of a GDDR6 transmitter is ¹⁄₂₄ Gbps, or roughly 41 ps. Variable m is the number of VFFE taps implemented in transmitter circuit 100. In the embodiment disclosed herein, transmitter circuit 100 has two VFFE taps, but it will be appreciated that other embodiments are not limited as such. Further, the number of transmitter slices in the embodiments described with reference to the figures is m plus 1, which provides for a VFFE-controlled transmitter slice for each VFFE tap, and a Main Tap.

The control signal generator of serializer block 102 generates a control signal containing enable data bits for enabling operation of the TFFE blocks 104a, 104b and 104c. The control signals are generated by serializer block 102 to have the same delay as the data bits for which they provide the enable signal. For example, serializer block 102 generates an $EN\_LATE_n$ signal, an $EN\_LATE_{n-1}$ signal, and an $EN\_LATE_{n-m}$ signal, representing the enable signal for the nth data bit, a one-UI delayed enable signal for $DB_{n-1}$, and an m-UI delayed enable signal for $DB_{n-m}$, respectively. The TFFE blocks receive a set of TFFE tap coefficients TFFETapC<K:0> from a processing circuit. The set of TFFE coefficients TFFETapC<K:0> may be stored in a database or other non-volatile memory, and are loaded into flash memory by the processing circuit for input into the transmitter TFFE blocks 104a, 104b and 104c. TFFE block 104a receives $DB_{n-m}$, $EN\_LATE_{n-m}$, and the TFFE coefficients, and outputs a time-domain equalized inverted and m-UI delayed data bit. TFFE block 104b receives $DB_{n-1}$, $EN\_LATE_{n-1}$, and the TFFE tap coefficients, and outputs a time-domain equalized inverted and one UI delayed data bit. TFFE block 104c receives $D_n$, $EN\_LATE_n$, and the TFFE tap coefficients, and outputs a time-domain equalized data bit. TFFE blocks 104a, 104b and 104c will be described in further detail with reference to FIGS. 2 and 3.

After performing time-domain equalization at TFFE blocks 104a, 104b, and 104c, data bits $DB_{n-1}$ and $DB_{n-m}$ are passed to two VFFE-controlled transmitter slices, Tap-1 and Tap-m. Both Tap-1 and Tap-m include a VFFE block and a transmitter (TX) driver. Tap-m includes VFFE block 106a and TX driver 110a, and receives the time-domain equalized data bits $DB_{n-m}$ and $D_n$. Tap-1 includes VFFE block 106b and TX driver 110b, and receives the time-domain equalized data bits $DB_{n-1}$ and $D_n$. The VFFE tap-controlled transmitter slices perform voltage-domain equalization of the received signals using a set of VFFE tap coefficients, VFFETapmC<1:0> for Tap-m, and VFFETap1C<1:0> for Tap-1. After voltage-domain equalization of the signals at blocks 106a and 106b, VFFE-controlled transmitter slices use TX drivers 110a and 110b to output the voltage-domain equalized data bits at the output pad. A separate, non-VFFE controlled Main Tap transmitter slice includes buffer 108 and TX driver 110c. Buffer 108 of the Main Tap receives $D_n$ and protects the original signal from any load-induced current or voltage, and passes the buffered $D_n$ to TX driver 110c for output at the output pad.

Figure 2:
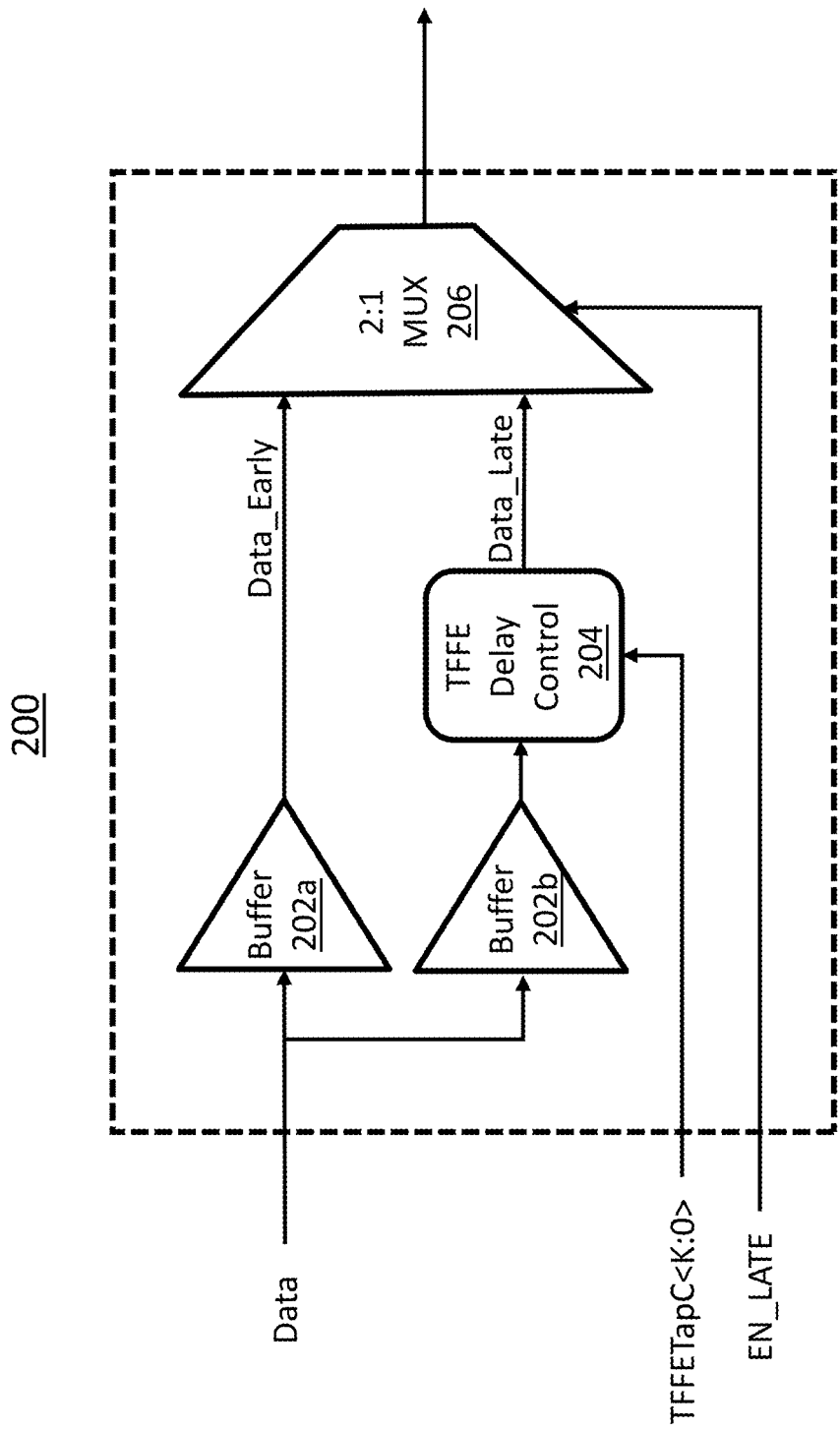
FIG. 2 is a block diagram further illustrating the TFFE block in the transmitter of FIG. 1, according to an embodiment.

Referring now to FIG. 2, an example block diagram illustrating a TFFE block in greater detail is shown. As discussed with reference to FIG. 1, the TFFE blocks all receive a data signal and an enable signal from the serializer and control signal generator, and the set of TFFE coefficients TFFETapC<K:0> from a processing circuit coupled to a storage configured to store the coefficients. The number of TFFE Tap Coefficients K is decided based on the TFFE Tap accuracy needed for the circuit. A higher value of K equates to finer resolution for the TFFE. However, increasing the value of K also increases the implementation hardware cost, and hence an optional value for K is 3 to 4. As can be seen in TFFE block 200, the TFFE is implemented using a series of buffers 202a and 202b, a TFFE delay control block 204, and a two-to-one multiplexer (MUX) 206. Buffers 202a and 202b both receive and protect the incoming data signal integrity from any load-induced current or voltage, and output two identical signals. The TFFE delay control block 204 receives the data signal output by buffer 202b, and implements a programmable time delay such that the incoming data is shifted by a time Δt and output to MUX 206. The amount of time delay of TFFE delay control block 204 is based on the TFFE tap coefficients TFFETapC<K:0>; changing the tap coefficient setting changes the value of Δt. In some embodiments, the TFFE circuit has a PVT-dependent programmable delay. In such an embodiment, a processing circuit connected to the transmitter will automatically track the process, voltage and temperature of operation, and determine the TFFE tap coefficients programmatically such that the value of Δt adjusts automatically with a PVT change, and will provide the TFFE tap coefficients as an input to TFFE delay control block 204. For example, in the event a PVT corner value is relatively slow, the value of Δt will be large; vice versa, if a PVT corner value is relatively fast, the value of Δt will be small.

TFFE 200 performs equalization of the received data signals by combining the buffered data signal from buffer 202a with the delayed data signal from TFFE delay control block 204 at MUX 206. For example, if TFFE 200 receives $D_{n-1}$ and $EN\_LATE_{n-1}$, MUX 206 receives a buffered $DB_{n-1}$ and a buffered $DB_{n-1+\Delta t}$ and combines the two signals accordingly when the corresponding enable signal is received. When these two signals are combined by MUX 206, all data bits toggling from long 0 to 1 (e.g., X001) are given a high time (UI+Δt) to transition, thereby reducing ISI jitter in the high-speed data path during the long 0 to 1 transition. Further, all data bits toggling from long 1 to 0 (e.g., X110) are given high time to transition, thereby reducing ISI jitter in the high-speed data path during the long 1 to 0 transition. All high frequency bits (e.g., 010101) are given UI time for transition.

Figure 3:
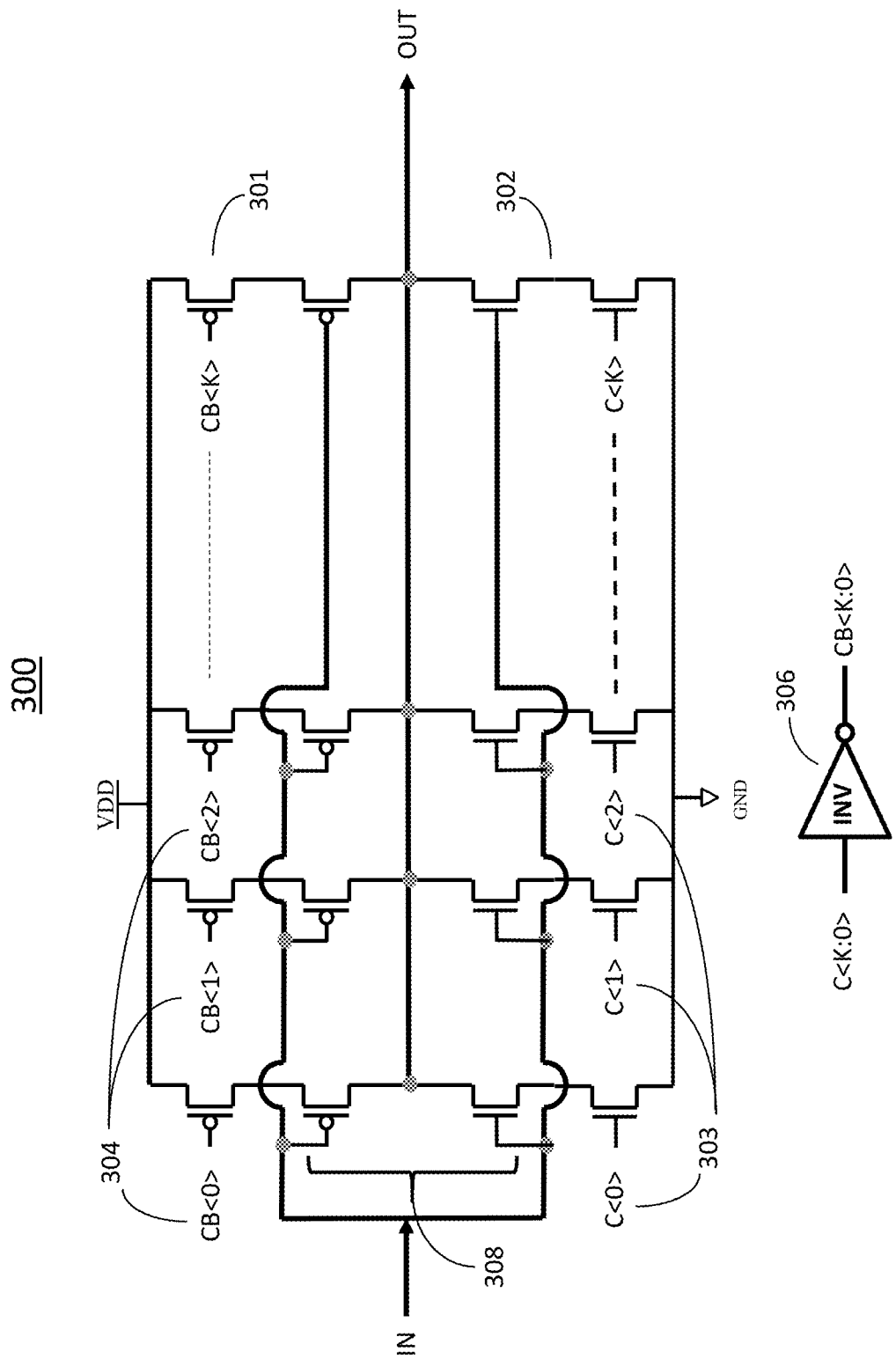
FIG. 3 is a schematic diagram illustrating an example implementation of a TFFE programmable delay, according to an embodiment.

FIG. 3 is a schematic diagram of an example circuit for implementing the TFFE delay control block described with reference to FIG. 2. Circuit 300 implements a delay on a data signal through a series of PMOS transistors 301, NMOS transistors 302, a set of original TFFE coefficients 303, and a set of inverted TFFE coefficients 304. The PMOS transistors 301 and NMOS transistors 302 are a series of transistor-based driver tap coefficients. The inverted TFFE coefficients 304 are simply the TFFE coefficients 303 passed through an inverter 306 prior to input into circuit 300. Circuit 300 also includes a set of CMOS gates 308, each CMOS gate consisting of a pair of one PMOS transistor 301 and one NMOS transistor 302, creating a digital logic inverter. Circuit 300 receives the data input at the CMOS gates 308, the inverted TFFE coefficients 304 at the PMOS transistors 301, and the original TFFE coefficients 303 at the NMOS transistors 302. The value of the inverted TFFE coefficients 304 are input at the gate of the PMOS transistors 301, and control whether the PMOS transistors 301 send a high (VDD) logic value or high impedance to the CMOS gates 308. The value of the original TFFE coefficients 303 are input at the gate of the NMOS transistors 302, and control whether the NMOS transistors 302 send a low (ground) logic value or high impedance to the CMOS gates 308. As activity collision of the data signals increases, the delay propagation of the PMOS devices 301 and NMOS devices 302 of the main data path will also increase. Additionally, The TFFE coefficients 303 and inverted TFFE coefficients 304 control the operation of the transistor-based driver taps that a known number of drivers are used to implement a fixed delay amount in circuit 300 according to the activity amount. An increased amount of delay results in more time-domain equalization when the original data is combined with the delayed signal at the multiplexer described in FIG. 2. The TFFE tap coefficients TFFETapC<K:0> are fixed and will not change with respect to time. However, the delay Δt generated by the CMOS devices for a given TFFE tap coefficient will change with Process Voltage and Temperature (PVT) because the CMOS device behavior changes according to the PVT. Therefore, the TFFE circuit will generate higher delay on a slow PVT corner and low delay on a fast PVT corner and hence perform a self-compensation within the TFFE for the transmitter, as the transmitter requires higher TFFE delay on a slow PVT corner and lower TFFE delay on a fast PVT corner.

Because the TFFE is used to equalize only the delay and ISI jitter imparted on the signal by the internal data path, several advantages are achieved. First, the implementation of TFFE delay is simple, requiring few elements and eliminating the need for a phase interpolator, thereby being less sensitive to power supply noise. Second, because the TFFE only performs equalization of the internal data path ISI jitter, a narrower TFFE range can properly equalize the signal because the data signals do not reach excessively high frequencies in the internal data path. As such, the narrow time margin of the data rate does not adversely affect transmitter operation, and the TFFE scheme is fully Process Voltage and Temperature (PVT) compensated.

Figure 4:
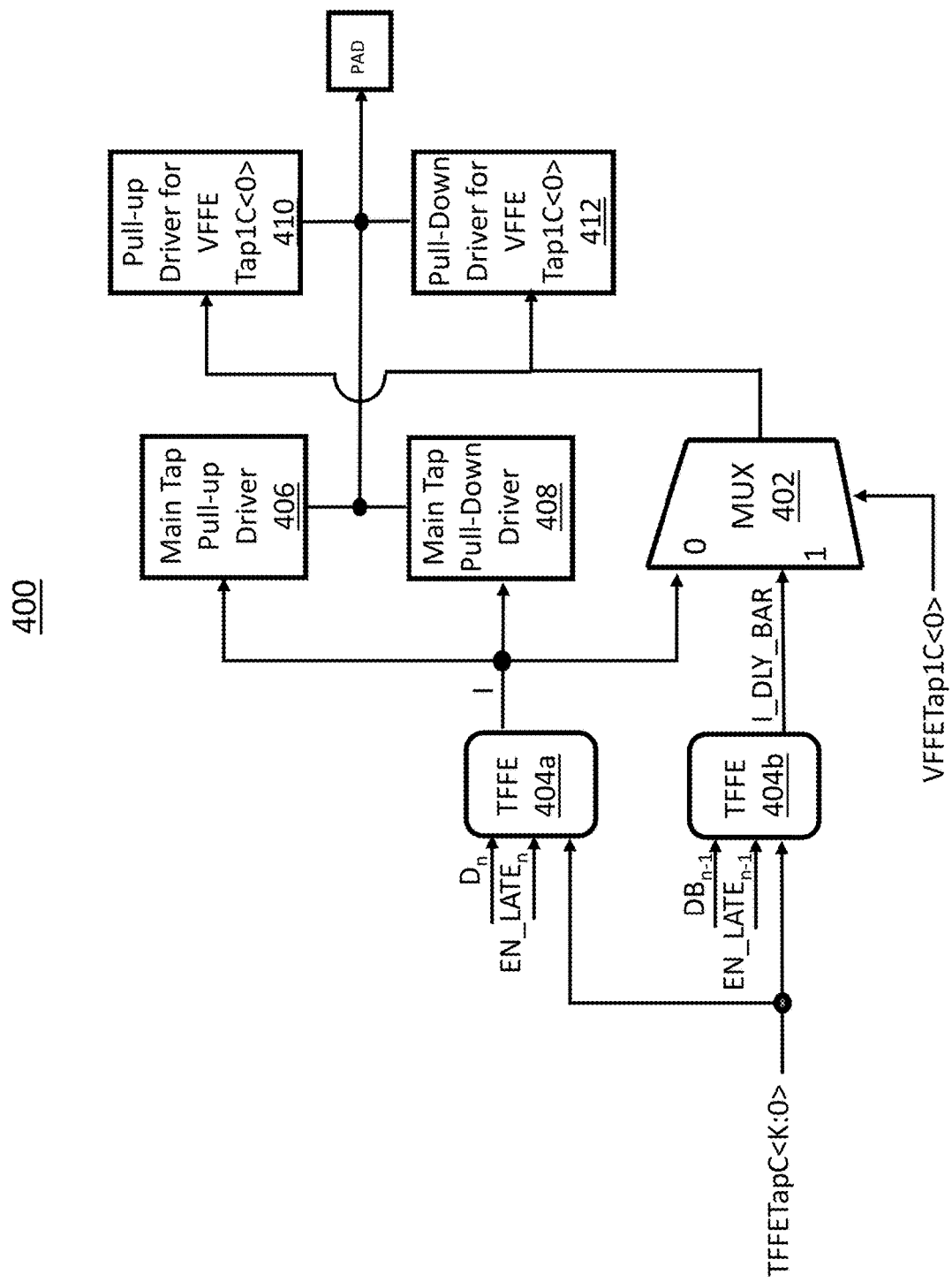
FIG. 4 is a block diagram further illustrating the VFFE block in the transmitter of FIG. 1, according to an embodiment.

Referring now to FIG. 4, an example block diagram illustrating the transmitter slices according to a single-tap embodiment is shown in greater detail. As shown in FIG. 1, each VFFE tap receives a time-domain equalized original data signal, a time-domain equalized inverted and delayed signal, and a set of VFFE tap coefficients; the main tap receives the time-domain equalized original data signal only. In actuality, the main tap consists of a pull-up driver 406 and a pull-down driver 408 connected to TFFE block 404a. Tap-1 of the VFFE consists of a multiplexer (MUX) 402 that receives the time-domain equalized original data signal, the time-domain equalized inverted and delayed signal, and the VFFE coefficient VFFETap1C<0>, and multiplexes the data into a single time-domain equalized and delayed data signal. MUX 402 then outputs the multiplexed data signal to a Tap-1 pull-up driver 410 and a Tap-1 pull-down driver 412. The VFFE coefficient VFFETap1C<0> determines whether or not VFFE will be applied to the slice depending upon what input is selected by the MUX 402. If VFFETap1C<0>=1, MUX 402 will select the MUX input 1, thereby passing 1 UI delayed inverted data I_DLY_BAR to the output of MUX 402 and VFFE will be applied to the slice. If VFFETap1C<0>=0, MUX 402 will select the MUX input 0, thereby passing main data 1 to the output of MUX 402 and hence VFFE functionality will be disabled for the slice, and only TFFE is applied on the data signal.

In the event voltage-domain equalization is enabled VFFETap1<0>=1, the VFFE coefficient VFFETap1<0> will select input 1 of MUX 402, and the delayed data will be passed through to the Tap-1 pull-up driver 410 and Tap-1 pull-down driver 412 at the same time the main data is passed to Main tap pull-up driver 406 and Main tap pull-down driver 408. In the VFFE circuit 400, the amplitude of all long 0 (e.g., X00) data bits are increased from logic low level at the driver output by turning ON some fraction of Tap-1 pull-up driver 410 and turning OFF some fraction of Tap-1 pull-down driver 412 using a set of VFFE coefficients, thereby reducing ISI jitter of the driver stage for the next 0 to 1 transition. The amplitude of all long 1 (e.g., X11) data bits are decreased from logic high level at the driver output by turning ON some fraction of Tap-1 pull-down driver 412 and turning OFF some fraction of Tap-1 pull-up driver 410 using the set of VFFE coefficients, thereby reducing ISI jitter of the driver stage for next 1 to 0 transition. The driver output is then passed to the output PAD. The amplitude of high frequency bits (e.g., 010101) remain unchanged during the voltage-domain equalization. The effective driver impedance also remains unchanged, thereby preserving the signal integrity of the high-speed data signal. The Main tap pull-up driver 406 and pull-down driver 408 pass the main data in a similar manner when enabled by the VFFE coefficient. Since the output of both the Main tap and Tap-1 are tied together, the VFFE coefficient decides which transmitter slice is enabled to output the data to the output PAD.

Figure 5:
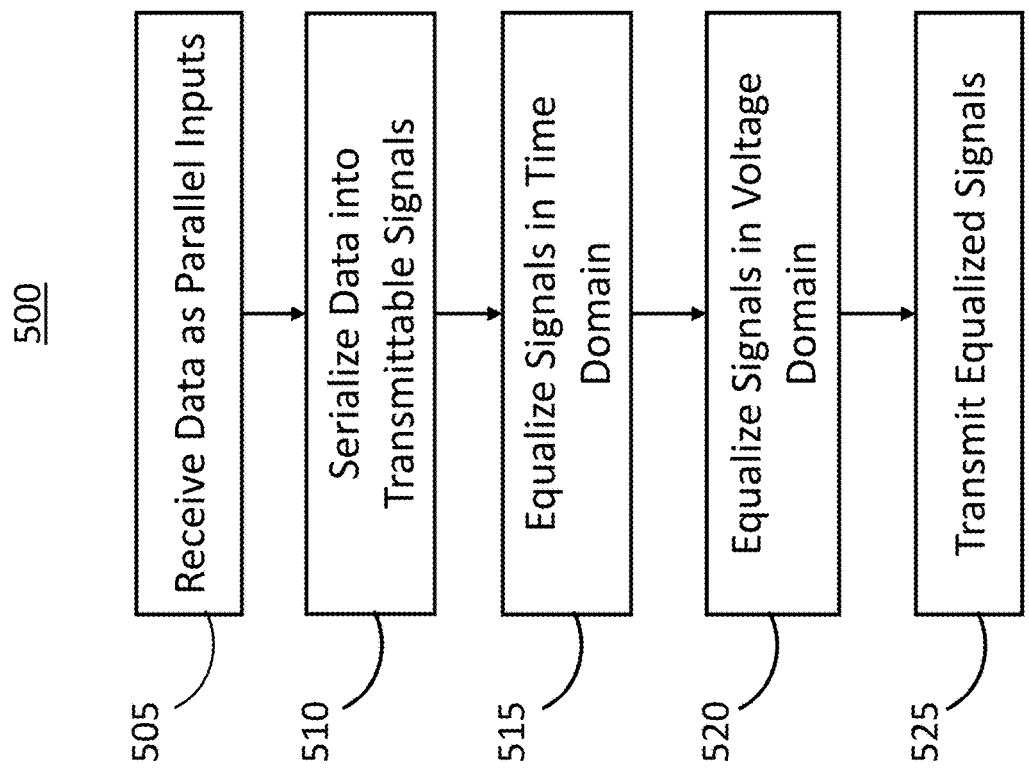
FIG. 5 is a flow chart illustrating a method for hybrid equalization of FIG. 1, according to an embodiment.

FIG. 5 is a flow chart illustrating a method for hybrid equalization of FIG. 1, according to an embodiment. The method starts at a step 505, wherein a serializer circuit receives a set of parallel data inputs and a clock signal from a processing circuit such that the serializer and the processor operate synchronously. Upon receiving the parallel data inputs, the serializer executes a step 510, wherein the serializer serializes the parallel data inputs into a series of transmittable signals consisting of data bits. The transmittable signals include an original data signal consisting of original data bits and at least one inverted and delayed signal according to the number of VFFE-controlled transmitter slices are in the circuit. The transmittable signals also include a set of enable signals corresponding to each data signal.

After generation of the transmittable signals, the method proceeds to a step 515. During step 515, the data signals generated in step 510 are equalized in the time-domain according to a set of TFFE coefficients input at a TFFE circuit. Step 515 may further include implementing a delay control circuit to delay the data signal a known amount. The TFFE circuit then outputs a time-domain equalized data signal, and the method progresses to a step 520. Step 520 consists of equalizing the data signals in the voltage domain using a VFFE circuit, or VFFE-controlled transmitter slice. This may occur at a single tap (single VFFE circuit) or a multi-tap (multiple VFFE circuits) type-VFFE. The voltage-domain equalization is implemented through a series of pull-up and pull-down drivers to decrease high logic values and increase low logic values according to a set of VFFE coefficients. After voltage equalization at the VFFE circuit, the method progresses to a step 525. Step 525 includes transmitting the equalized data signal as an output of the circuit. Each VFFE-controlled transmitter slice acts as a parallel transmitter to the other slices in the overall transmitter, and outputs the hybrid equalized data.

Figure 6A:
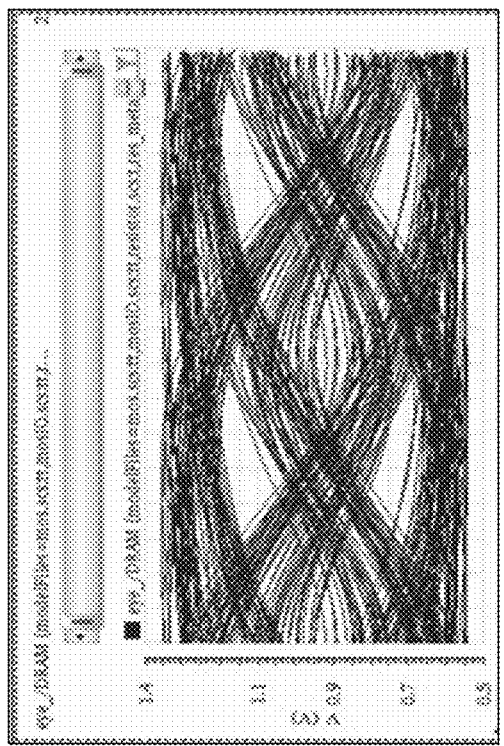
FIG. 6A is an eye diagram illustrating the transient performance of a 24 Gbps GDDR6 transmitter without a Transformer-coil (T-coil) or an equalization scheme, according to an embodiment.
Figure 6C:
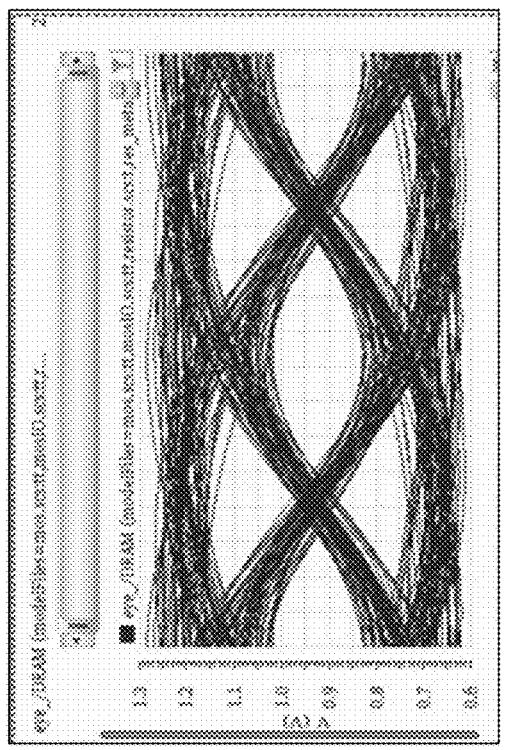
FIG. 6C is an eye diagram illustrating the transient performance for a 24 Gbps GDDR6 transmitter without a Transformer-coil (T-coil) and a double tap hybrid equalization scheme, according to an embodiment.
Figure 6B:
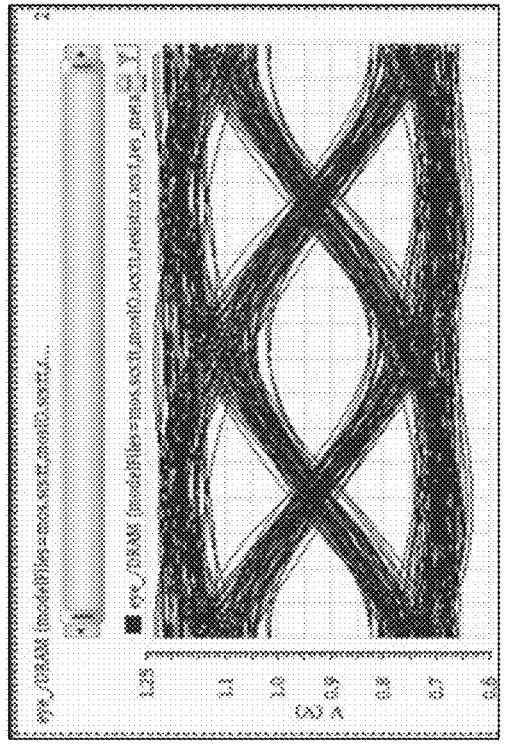
FIG. 6B is an eye diagram illustrating the transient performance for a 24 Gbps GDDR6 transmitter without a Transformer-coil (T-coil) and a single tap hybrid equalization scheme, according to an embodiment.

FIGS. 6A, 6B and 6C are eye diagrams depicting the impact of the multi-tap hybrid equalization scheme described herein in a transmitter without a Transformer-coil (T-coil). Eye diagrams are a way of evaluating the quality of a received signal, or the ability to correctly recover symbols and timing, and reveal the impact of ISI jitter and noise detected on the signal. An eye diagram is constructed from a received digital waveform (such as at a receiver input) by folding the waveform corresponding to each individual bit into a single graph. The eye height is a measure of signal amplitude, and the eye width is a measure of the unit interval, or single bit period. FIG. 6A is an eye diagram depicting the output of a transmitter without a T-coil or any equalization of the data path. It is clear from FIG. 6A that the received data signal is experiencing high levels of ISI jitter and noise, and the eye is fully closed. In contrast, FIGS. 6B and 6C are both eye diagrams depicting the output of the same transmitter while implementing a one-tap hybrid equalization scheme and a two-tap hybrid equalization scheme, respectively. FIG. 6B, the 1-tap hybrid equalization scheme, has one TFFE and VFFE tap, and has an eye jitter of 10.24 ps and an eye height of 189 mV. FIG. 6C, the two-tap hybrid equalization scheme, has one TFFE and two VFFE taps, and has an eye jitter of 8.87 ps and an eye height of 189 mV. The multi-tap hybrid equalization scheme improves the eye open area of FIG. 6A significantly, and improves the eye open area by 35% with respect to equalization schemes utilizing a TFFE tap or a VFFE tap alone.

Figure 7B:
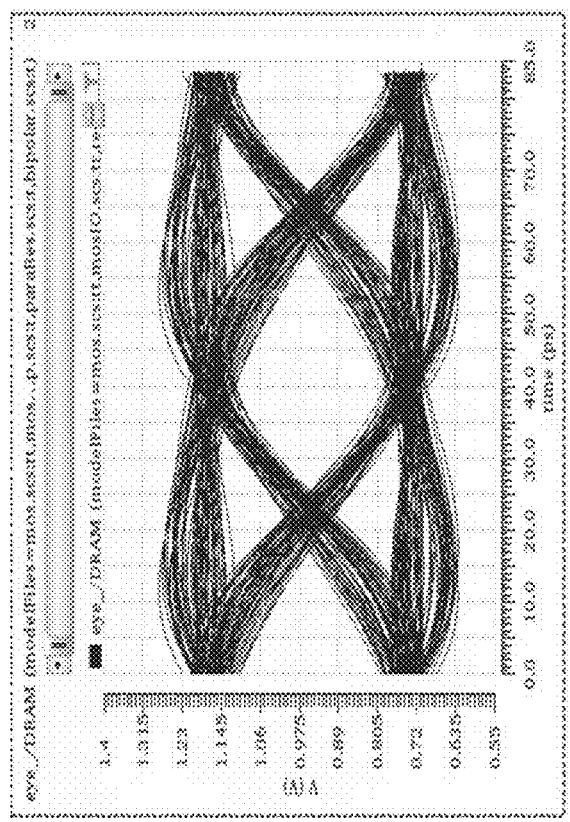
FIG. 7B is an eye diagram illustrating the transient performance for a 24 Gbps GDDR6 transmitter with a Transformer-coil (T-coil) and a single tap hybrid equalization scheme, according to an embodiment.
Figure 7A:
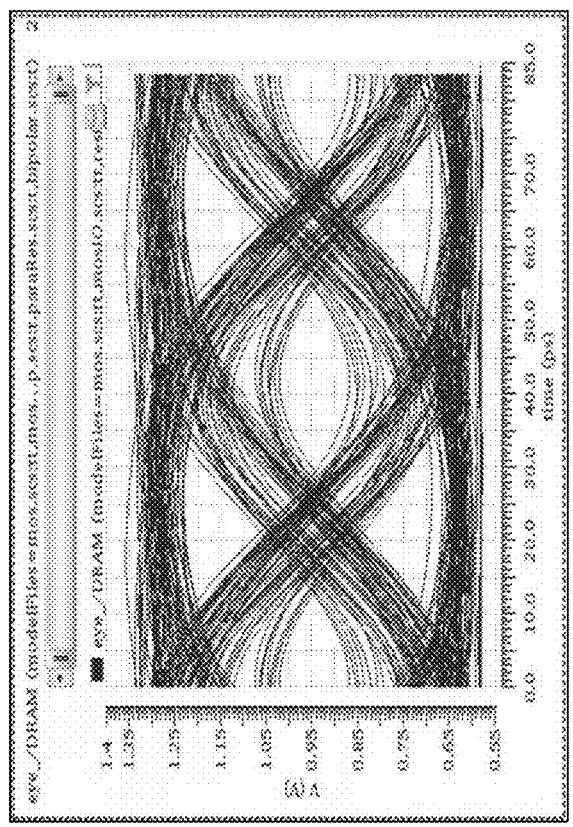
FIG. 7A is an eye diagram illustrating the transient performance for a 24 Gbps GDDR6 transmitter with a Transformer-coil (T-coil) and without an equalization scheme, according to an embodiment.

FIGS. 7A and 7B eye diagrams depicting the impact of the multi-tap hybrid equalization scheme described herein in a transmitter with a T-coil. FIG. 7A is an eye diagram depicting the output of a transmitter with a T-coil, but without any equalization of the data path, and has an eye jitter of 16.73 ps and an eye height of 154 mV. FIG. 7B is an eye diagram depicting the output of the same transmitter while implementing a one-tap hybrid equalization scheme, and has an eye jitter of 8.6 ps and an eye height of 328 mV. In transmitters with a T-coil, the one-tap hybridization scheme improves the eye area by 20% with respect to equalization schemes using a TFFE tap or a VFFE tap alone.

According to the embodiments described herein, a method for equalization of data signals is described. The method includes receiving, by one or more time-feed forward equalization (TFFE) circuits, a plurality of signals, a first TFFE circuit receiving an original data signal comprising original data bits and an enable signal comprising enable data bits, and a second TFFE circuit receiving an altered data signal comprising altered data bits and an altered enable signal comprising altered enable bits. The method can further include generating, by the first TFFE circuit, from the original data signal and the enable signal, a time-domain-equalized original data signal using a set of TFFE coefficients. The method can further include generating, by the second TFFE circuit, from the altered data signal and the altered enable signal, a time-domain-equalized altered data signal using the set of TFFE coefficients. The method can further include generating, at a voltage-feed forward equalization (VFFE) circuit coupled to the first and second TFFE circuits, a time-and-voltage-domain-equalized data signal from the time-domain-equalized original data signal and the time-domain-equalized altered data signal using a set of VFFE coefficients.

In some embodiments, the method can further include receiving, at the VFFE circuit, the time-domain-equalized original data signal from the first TFFE circuit. The method can further include receiving, at the VFFE circuit, the time-domain-equalized altered data signal from the second TFFE circuit. The method can further include outputting, at a contact pad, the time-and-voltage-domain-equalized data signal.

In some embodiments, the method can further include receiving, by a serializer circuit, a set of parallel input data signals and a clock signal. The method may further include serializing, by the serializer circuit, the set of parallel data inputs into the plurality of data signals received at the one or more TFFE circuits. The method can further include generating, by a serializer circuit, the altered data signal by inverting and delaying the original data signal by a multiple of a unit interval (UI). The method may also further include generating, by the serializer circuit, the altered enable signal by delaying the enable signal by the multiple of the UI.

In some embodiments, the method can include enabling, at the VFFE circuit, a multiplexer of the VFFE circuit to multiplex the time-domain equalized original data signal and the time-domain altered data signal together. The method can further include increasing, at the VFFE circuit, a logic low level of the multiplexed data signal by turning on a pull-up driver and turning off a pull-down driver using the set of VFFE coefficients. The method may further include decreasing, at the VFFE circuit, a logic high level of the multiplexed data signal by turning off the pull-up driver and turning on a pull-down driver using the set of VFFE coefficients.

In some embodiments, the method can include storing, at a non-transitory machine-readable storage, the set of TFFE coefficients and the set of VFFE coefficients. The method may also further include implementing, by a programmable delay circuit, a delay to the first and second TFFE circuits by operating a series of driver taps according to the set of TFFE coefficients. The method may further include a fixed TFFE coefficient which generates the Process Voltage and Temperature (PVT) dependent delay Δt and hence perform the self PVT compensation for the TFFE used in the transmitter to equalize the internal high speed data path.

In some embodiment, a programmable circuit for equalization of data signals is provided. The programmable circuit can include one or more time feed forward equalization (TFFE) circuits. The TFFE circuits can receive a plurality of data signals including an original data signal comprising original data bits, an enable signal comprising enable bits, an altered data signal comprising altered data bits and an altered enable signal comprising altered enable bits. The TFFE circuits can further generate, from the original data signal and the altered data signal according to a set of TFFE coefficients, a time-domain-equalized original data signal. The TFFE circuits can further generate, from the altered data signal and the altered enable signal according to the set of TFFE coefficients, a time-domain-equalized altered data signal. The programmable circuit can further include a voltage feed forward equalization (VFFE) circuit coupled to both the TFFE circuits. The VFFE circuit can generate, from the time-domain-equalized original data signal and the time-domain-equalized altered data signal, a time-and-voltage-domain-equalized data signal according to a set of VFFE coefficients.

In some embodiments, the VFFE circuit can further receive the time-domain-equalized original data signal from the first TFFE circuit. The VFFE circuit may further receive the time-domain-equalized altered data signal from the second TFFE circuit. In some embodiments, the programmable circuit can include a contact pad configured to output the time-and-voltage-domain-equalized data signal after equalization by the VFFE circuit.

In some embodiments, the programmable circuit can include a serializer circuit. The serializer circuit can receive a set of parallel input data signals and a clock signal. The serializer circuit can further serialize the set of parallel data inputs into the original data signal, the enable signal, the altered data signal, and the altered enable signal.

In some embodiments, the VFFE circuit comprises a multiplexer configured to generate, from the set of VFFE coefficients, the time-equalized original data signal, and the time-equalized altered data signal, a multiplexed data signal. The VFFE can be further configured to increase a logic low level of the multiplexed data signal by turning on a pull-up driver and turning off a pull-down driver using the set of VFFE coefficients. The VFFE circuit can be further configured to decrease a logic high level of the multiplexed data signal by turning off the pull-up driver and turning on a pull-down driver using the set of VFFE coefficients.

In some embodiments, the altered data signal is the original data signal inverted and delayed by a multiple of a unit interval (UI), and the altered enable signal is the enable signal delayed by the multiple of the UI.

In some embodiments, the programmable circuit further includes a non-transitory machine-readable storage configured to store the set of TFFE coefficients and the set of VFFE coefficients. In some embodiments, each of the first and second TFFE circuits have a programmable delay controlled by the set of TFFE coefficients. The programmable circuit may further include a processing circuit. The processing circuit can be configured to determine the set of TFFE coefficients that generate the "Process, Voltage, and Temperature" (PVT) dependent delay ($\Delta t$), which performs the self PVT compensation of a high speed data path.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the invention. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A method for equalization of data signals, the method comprising:
   receiving, by a first time-feed forward equalization (TFFE) circuit, an original data signal comprising original data bits and an enable signal comprising enable data bits;
   receiving, by a second TFFE circuit, an altered data signal comprising altered data bits and an altered enable signal comprising altered enable bits;
   generating, by the first TFFE circuit, from the original data signal and the enable signal, a time-domain-equalized original data signal using a set of TFFE coefficients;
   generating, by the second TFFE circuit, from the altered data signal and the altered enable signal, a time-domain-equalized altered data signal using the set of TFFE coefficients; and
   generating, at a voltage-feed forward equalization (VFFE) circuit coupled to the first and second TFFE circuits, a time-and-voltage-domain-equalized data signal from the time-domain-equalized original data signal and the time-domain-equalized altered data signal using a set of VFFE coefficients.

2. The method for equalization of data signals according to claim 1, further comprising:
   receiving, at the VFFE circuit, the time-domain-equalized original data signal from the first TFFE circuit; and
   receiving, at the VFFE circuit, the time-domain-equalized altered data signal from the second TFFE circuit.

3. The method for equalization of data signals according to claim 1, further comprising outputting, at a contact pad, the time-and-voltage-domain-equalized data signal.

4. The method for equalization of data signals according to claim 1, further comprising:
 receiving, by a serializer circuit, a set of parallel input data signals and a clock signal; and
 serializing, by the serializer circuit, the set of parallel data inputs into the plurality of data signals received at the TFFE circuits.

5. The method for equalization of data signals according to claim 1, further comprising:
 enabling, at the VFFE circuit, a multiplexer of the VFFE circuit to multiplex the time-domain equalized original data signal and the time-domain altered data signal together;
 increasing, at the VFFE circuit, a logic low level of the multiplexed data signal by turning on a pull-up driver and turning off a pull-down driver using the set of VFFE coefficients; and
 decreasing, at the VFFE circuit, a logic high level of the multiplexed data signal by turning off the pull-up driver and turning on the pull-down driver using the set of VFFE coefficients.

6. The method for equalization of data signals according to claim 1, further comprising generating, by a serializer circuit, the altered data signal by inverting and delaying the original data signal by a multiple of a unit interval (UI).

7. The method for equalization of data signals according to claim 4, further comprising generating, by the serializer circuit, the altered enable signal by delaying the enable signal by the multiple of the UI.

8. The method for equalization of data signals according to claim 1, further comprising storing, at a non-transitory machine-readable storage, the set of TFFE coefficients and the set of VFFE coefficients.

9. The method for equalization of data signals according to claim 1, further comprising implementing, by a programmable delay circuit, a delay to the first and second TFFE circuits by operating a series of driver taps according to the set of TFFE coefficients.

10. The method for equalization of data signals according to claim 9, further comprising:
 adjusting, the delay of the first and second TFFE circuits by a Process Voltage and Temperature (PVT) dependent delay generation circuit to compensate for high speed data path PVT variation.

11. A programmable circuit for equalization of data signals, the circuit comprising:
 a first time feed forward equalization (TFFE) circuit and a second TFFE circuit, the first and the second TFFE circuits configured to:
  receive, by the first TFFE circuit, an original data signal comprising original data bits, and an enable signal comprising enable bits;
  receive, by the second TFFE circuit, an altered data signal comprising altered data bits and an altered enable signal comprising altered enable bits;
  generate, by the first TFFE circuit, from the original data signal and the altered data signal according to a set of TFFE coefficients, a time-domain-equalized original data signal; and
  generate, by the second TFFE circuit, from the altered data signal and the altered enable signal according to the set of TFFE coefficients, a time-domain-equalized altered data signal; and a voltage feed forward equalization (VFFE) circuit coupled to each of the TFFE circuits, the VFFE circuit configured to:
  generate, from the time-domain-equalized original data signal and the time-domain-equalized altered data signal, a time-and-voltage-domain-equalized data signal according to a set of VFFE coefficients.

12. The programmable circuit for equalization of data signals according to claim 11, wherein the VFFE circuit is further configured to:
 receive the time-domain-equalized original data signal from the first TFFE circuit; and
 receive the time-domain-equalized altered data signal from the second TFFE circuit.

13. The programmable circuit for equalization of data signals according to claim 11, further comprising a serializer circuit configured to:
 receive a set of parallel input data signals and a clock signal; and
 serialize the set of parallel data inputs into the original data signal, the enable signal, the altered data signal, and the altered enable signal.

14. The programmable circuit for equalization of data signals according to claim 11, wherein the VFFE circuit comprises a multiplexer configured to generate, from the set of VFFE coefficients, the time-equalized original data signal, and the time-equalized altered data signal, a multiplexed data signal; and
 wherein the VFFE circuit is further configured to:
  increase a logic low level of the multiplexed data signal by turning on a pull-up driver and turning off a pull-down driver using the set of VFFE coefficients; and
  decrease a logic high level of the multiplexed data signal by turning off the pull-up driver and turning on the pull-down driver using the set of VFFE coefficients.

15. The programmable circuit for equalization of data signals according to claim 11, further comprising a contact pad configured to output the time-and-voltage-domain-equalized data signal.

16. The programmable circuit for equalization of data signals according to claim 11, wherein the altered data signal comprises the original data signal inverted and delayed by a multiple of a unit interval (UI).

17. The programmable circuit for equalization of data signals according to claim 16, wherein the altered enable signal comprises the enable signal delayed by the multiple of the UI.

18. The programmable circuit for equalization of data signals according to claim 11, further comprising a non-transitory machine-readable storage configured to store the set of TFFE coefficients and the set of VFFE coefficients.

19. The programmable circuit for equalization of data signals according to claim 11, wherein each of the first and second TFFE circuits have a programmable delay controlled by the set of TFFE coefficients.

20. The programmable circuit for equalization of data signals according to claim 19, further comprising a processing circuit configured to:
 to generate Process Voltage and Temperature (PVT) dependent delay; and
 adjust the delay of the first and second TFFE circuits to compensate the high speed data path for PVT.

* * * * *